(12) United States Patent
Koshimaki et al.

(10) Patent No.: US 10,289,781 B2
(45) Date of Patent: May 14, 2019

(54) MANAGEMENT APPARATUS, SUBSTRATE PROCESSING SYSTEM AND NON-TRANSITORY COMPUTER-READABLE RECORDING MEDIUM

(71) Applicant: HITACHI KOKUSAI ELECTRIC INC., Tokyo (JP)

(72) Inventors: Toshiro Koshimaki, Toyama (JP); Kazuhide Asai, Toyama (JP); Hideto Shimizu, Toyama (JP); Kayoko Yashiki, Toyama (JP); Kazuyoshi Yamamoto, Toyama (JP); Nobuhisa Makino, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/946,965

(22) Filed: Nov. 20, 2015

(65) Prior Publication Data
US 2016/0078163 A1  Mar. 17, 2016

Related U.S. Application Data

(63) Continuation of application No. PCT/JP2014/063336, filed on May 20, 2014.

(30) Foreign Application Priority Data

May 22, 2013  (JP) .................................. 2013-108226

(51) Int. Cl.
*G06F 17/50*  (2006.01)
*G05B 19/00*  (2006.01)
(Continued)

(52) U.S. Cl.
CPC ....... *G06F 17/5045* (2013.01); *G05B 19/042* (2013.01); *G05B 19/00* (2013.01);
(Continued)

(58) Field of Classification Search
CPC ............ G05B 19/418; G05B 19/41865; G05B 19/41875; G05B 19/41888; G05B 19/00;
(Continued)

(56) References Cited

U.S. PATENT DOCUMENTS 7,209,798 B2 *  4/2007  Yamashita .............. H01L 22/20
257/E21.314
7,305,320 B2 * 12/2007  Ahmed ............ G05B 19/41865
438/14

(Continued)

FOREIGN PATENT DOCUMENTS

JP  2006-073845 A   3/2006
JP  2007-294773 A  11/2007
JP  2007-299824 A  11/2007

*Primary Examiner* — Stacy Whitmore
(74) *Attorney, Agent, or Firm* — Volpe and Koenig, P.C.

(57) ABSTRACT

A management apparatus includes: a manipulation & display unit including a user interface for selecting a reference device information, and configured to display: a difference between the device information obtained from the substrate processing device and the reference device information selected via the user interface; a content of the reference device information; and a content of the device information, and further configured to receive a command for modifying the device information; and a control unit configured to modify the device information based on the command received from the manipulation & display unit and configured to transmit a modified device information to the substrate processing device.

12 Claims, 12 Drawing Sheets

(51) Int. Cl.
  *G05B 19/042* (2006.01)
  *H01L 21/66* (2006.01)
  *G05B 19/418* (2006.01)

(52) U.S. Cl.
  CPC ...... *G05B 19/418* (2013.01); *G05B 19/41865* (2013.01); *G05B 19/41875* (2013.01); *G05B 2219/00* (2013.01); *G05B 2219/23295* (2013.01); *G05B 2219/45031* (2013.01); *H01L 22/20* (2013.01); *Y02P 90/265* (2015.11)

(58) Field of Classification Search
  CPC ...... G05B 2219/00; G05B 2219/45031; G06F 17/5045; H01L 22/20
  USPC ............................ 700/121, 124; 716/51, 100
  See application file for complete search history.

(56) References Cited

U.S. PATENT DOCUMENTS

| | | | | |
|---|---|---|---|---|
| 7,340,320 B2* | 3/2008 | Takizawa | ................ | H01L 22/20 257/E21.525 |
| 7,797,067 B2* | 9/2010 | Kumagai | ......... | G05B 19/41865 700/96 |
| 7,885,789 B2* | 2/2011 | Funakoshi | ....... | G05B 19/41875 702/180 |
| 8,521,622 B2* | 8/2013 | Tanaka | ............ | G05B 19/41865 700/121 |
| 8,594,826 B2* | 11/2013 | Aharoni | ............. | G05B 23/0216 438/16 |
| 8,660,336 B2* | 2/2014 | Ueno | ................. | G01N 21/9501 356/237.1 |
| 9,165,091 B2* | 10/2015 | Morinaga | ............... | G06F 17/50 |
| 9,280,151 B2* | 3/2016 | Chang | ............... | G05B 19/41865 |
| 2002/0062162 A1* | 5/2002 | Bunkofske | ......... | G05B 23/0221 700/108 |
| 2006/0161284 A1* | 7/2006 | Ikeno | ............... | G05B 19/41865 700/99 |
| 2006/0287754 A1* | 12/2006 | Sugamoto | ........ | G05B 19/41875 700/121 |
| 2007/0038326 A1* | 2/2007 | Behm | ............... | G05B 19/4188 700/121 |
| 2007/0192056 A1* | 8/2007 | Ahmed | ............ | G05B 19/41865 702/155 |
| 2008/0065696 A1* | 3/2008 | Ahmed | ............ | G05B 19/41865 |
| 2009/0082897 A1* | 3/2009 | Cain | .................... | G06F 17/5068 700/121 |
| 2009/0276078 A1* | 11/2009 | Sugamoto | ........ | G05B 19/41875 700/121 |
| 2009/0292385 A1* | 11/2009 | Flach | ............... | G05B 19/41875 700/108 |
| 2010/0106279 A1* | 4/2010 | Yamamoto | ........ | G05B 19/41865 700/105 |
| 2013/0310960 A1* | 11/2013 | Chang | ............. | G05B 19/41865 700/97 |
| 2014/0058551 A1* | 2/2014 | Morinaga | ............... | G06F 17/50 700/121 |

* cited by examiner

FIG. 4

DEVICE #1
   File 01
   File 02
   File 03
     :
   File nn

DEVICE #2
   File 02
   File 03
     :
   File nn

DEVICE #3
   File 02

DEVICE #4
   File 01
   File 02

DEVICE #n
   File 01
   File 02
   File 03

FIG. 5

| DEVICE NAME | MASTER ASSIGNMENT | COMPARISON FILE NAME | EDIT FLAG |
|---|---|---|---|
| DEVICE #1 | MASTER | File02 | OFF |
| DEVICE #2 | - | - | OFF |
| DEVICE #3 | - | - | OFF |
| DEVICE #4 | - | - | OFF |
| ⋮ | ⋮ | ⋮ | ⋮ |
| DEVICE #n | - | - | OFF |

FIG. 6

| DEVICE NAME | DEVICE #1 | DEVICE #2 | DEVICE #3 | DEVICE #n |
|---|---|---|---|---|
| FILE NAME | RECIPE 1 | RECIPE 1 | RECIPE 1 | RECIPE 1 |
| ⋮ | ⋮ | ⋮ | ⋮ | ⋮ |
| TEMPERATURE SETTING VALUE | 300 | 295 | 300 | 295 |
| PRESSURE SETTING VALUE | 10000 | 10000 | 9900 | 10000 |
| ⋮ | ⋮ | ⋮ | ⋮ | ⋮ |

FIG. 10

| MFC INFORMATION: Ch 18 | [C13-N2] | [C13-N2] | | [C13-N2] | | [C13-N2] | |
|---|---|---|---|---|---|---|---|
| CHECK VALUE UNIT | 0 | | 0 | | 1 | | 0 |
| RAMPRATE UNIT | LM | | LM | | atm | | LM |
| SETTING VALUE | 1 | | 1 | | 2 | | 1 |

MARK WITH SPACES BECAUSE EACH PARAMETER VALUE IS THE SAME

FIG. 11A

| ITEM | DEVICE #1 | DEVICE #2 | DEVICE #3 | DEVICE #4 |
|---|---|---|---|---|
| HEADER INFOMATION | | | | |
| EQUIPMENT NAME | EQ01 | EQ02 | | Q03 |
| FILE NAME | MAIN RECIPE 001 | MAIN RECIPE 001 | MASTER / HIDE | MAIN RECIPE 010 |
| ... | | | | |
| CREATE TIME | 2012/10/03 | 2012/10/0 SELECT [HIDE] | | 2013/07/10 |

FIG. 11B

| ITEM | DEVICE #1 | DEVICE #2 | DEVICE #4 | DEVICE #5 |
|---|---|---|---|---|
| HEADER INFOMATION | | | | |
| EQUIPMENT NAME | EQ01 | EQ02 | EQ03 | EQ10 |
| FILE NAME | MAIN RECIPE 001 | MAIN RECIPE 001 | MAIN RECIPE 010 | MAIN RECIPE 200 |
| ... | | | | |
| CREATE TIME | 2012/10/03 | 2012/10/05 | 2013/07/10 | 2013/09/25 |

FIG. 12A

| TEMP ITEM CH02 | DEVICE #1 (MASTER) | | DEVICE #2 | | DEVICE #3 | | DEVICE #4 | |
|---|---|---|---|---|---|---|---|---|
| | CENTER UPPER | | CENTER UPPER | | CENTER UPPER | | CENTER UPPER | |
| SETTING VALUE | ▶300.00 SORT ● | | ▶305.00 | | ▶305.00 | | ▶300.00 | |
| MONITOR VALUE | 302.00 | | 302.00 | | 302.00 | | 302.00 | |
| | SELECT [SORT] | | | | | | | |

FIG. 12B

| TEMP ITEM CH02 | DEVICE #1 (MASTER) | | DEVICE #2 | | DEVICE #4 | | DEVICE #3 | |
|---|---|---|---|---|---|---|---|---|
| | CENTER UPPER | | CENTER UPPER | | CENTER UPPER | | CENTER UPPER | |
| SETTING VALUE | ▶300.00 | | ▶305.00 | | ▶305.00 | | ▶300.00 | |
| MONITOR VALUE | ▶302.00 | | ▶302.00 | | ▶302.00 | | ▶302.00 | |

FIG. 13A

| ITEM | DEVICE #1 | DEVICE #2 | DEVICE #3 | DEVICE #4 |
|---|---|---|---|---|
| HEADER INFORMATION | | | MASTER | |
| EQUIPMENT NAME | EQ01 | EQ02 | EQ03 | |
| FILE NAME | MAINRECIPE001 | MAINRECIPE001 | MAINRE | ECIPE010 |
| : | | | | |
| CREATE TIME | 2012/10/03 | 2012/10/05 | 2013/12/25 | 2013/07/10 |
| : | | | | |

SELECT MASTER

FIG. 13B

| ITEM | DEVICE #2 | DEVICE #1 | DEVICE #3 | DEVICE #4 |
|---|---|---|---|---|
| HEADER INFORMATION | | | | |
| EQUIPMENT NAME | EQ02 | | | EQ03 |
| FILE NAME | MAINRECIPE | | | MAINRECIPE010 |
| : | | | | |
| CREATE TIME | 2012/10/05 | 2012/10/03 | 2013/12/25 | 2013/07/10 |
| : | | | | |
| STEP INFORMATION 1 | | | | |
| STEP ID | 10 | 10 | 10 | 10 |
| STEP NAME | BUP | BUP | BUP | BUP |
| : | | | | |
| STEP TIME | 00:00:30:00 | 00:00:30:00 | 00:00:30:00 | 00:00:30:00 |
| TEMPERATURE INFORMATION | | | | |
| TEMP ITEM CH01 | | | | |
| SETTING NAME | UPPER | UPPER | UPPER | UPPER |
| SETTING VALUE | 300.00 | 300.00 | 300.00 | 305.00 |
| SETTING UNIT | degC/min | degC/min | degC/min | degC/min |
| : | | | | |
| TEMP ITEM CH02 | CENTER UPPER | CENTER UPPER | CENTER UPPER | CENTER UPPER |
| : | | | | |
| SETTING VALUE | 300.00 | 305.00 | 305.00 | 300.00 |
| : | | | | |
| MONITOR VALUE | 302.00 | 302.00 | 302.00 | 302.00 |
| : | | | | |

DEVICE #2 IS SWITCHED TO MASTER AND MOVED TO LEFT SIDE OF SCREEN

PARAMETER COMPARISON IS PERFORMED AGAIN FOR EACH PARAMETER

MANAGEMENT APPARATUS, SUBSTRATE PROCESSING SYSTEM AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2013-108226, filed on May 22, 2013 and PCT/JP2014/063336, filed on May 20, 2014, the entire contents of which are hereby incorporated by reference.

BACKGROUND OF THE INVENTION

1. Field of the Invention

The present invention relates to a management apparatus configured to manage device information stored in a file such as a film forming recipe or the like stored in a substrate processing device for processing a substrate such as a wafer or the like, a substrate processing system including the management apparatus and the substrate processing device, and a non-transitory computer-readable recording medium. The substrate processing device performs, for example, a process such as a film forming process or the like on a semiconductor substrate (e.g., a semiconductor wafer) on which a semiconductor integrated circuit (hereinafter referred to as an IC) is manufactured.

2. Description of the Related Art

In a large-scale semiconductor manufacturing plant (hereinafter referred to as a plant), a management apparatus for intensively managing a substrate processing device group including a plurality of substrate processing devices is introduced, and monitoring of production, accumulation and reference of production history or failure history and the like of each substrate processing device under the management apparatus may be performed by the management apparatus. The management apparatus and each substrate processing device are connected through a network such as a local area network (LAN) in which high-speed communication is possible or the like. Also, each substrate processing device stores a substrate processing recipe for processing a substrate and performs substrate processing based on the substrate processing recipe stored therein.

Meanwhile, since the substrate processing of the same content is performed on the plurality of substrate processing devices in parallel, a plurality of same substrate processing devices in which the substrate processing of the same content is performed, for example, a plurality of the same film forming devices for performing the same film forming process, is included in the plurality of substrate processing devices. Although the substrate processing recipe of the same substrate processing device originally has the same content, there are cases in which the substrate processing recipe is improved in a substrate processing device while the substrate processing is repeated, for example, a case in which a parameter setting value of the substrate processing recipe (e.g., a temperature setting value of a substrate processing chamber) is changed. Also, when a result thereof is good, the substrate processing recipe is applied to the other same substrate processing devices.

In this case, the improved substrate processing recipe file and a plurality of substrate processing recipe files stored in the other substrate processing devices are compared, a different parameter is determined and output, and the change of the substrate processing recipe file of the other substrate processing devices is performed based on the different output parameter.

A file comparing and updating process in the related art will be described with reference to FIG. 9. FIG. 9 is a flowchart for describing the file comparing and updating process according to the related art. In the example, a substrate processing device #1 stores an appropriate file. Also, files stored in a plurality of other substrate processing devices (a substrate processing device #2 and the like) are compared to the appropriate file of the substrate processing device by the management apparatus, and the files of the substrate processing device #1 and the like are modified to match to the file of the substrate processing device when there is a difference. The substrate processing device, the substrate processing device #1 and the like are installed in a clean room, and are connected to the management apparatus installed in an office through a network such as a LAN.

First, the management apparatus obtains the file of the substrate processing device #1 [S61 in FIG. 9], obtains the file of the substrate processing device #2 [S62], and compares the two obtained files [S63]. As a result of the comparison [S64], when there is no difference between the two files, the processing ends. When there is a difference of between the two files, the comparison result is output (e.g., comma-separated values (CSV) output) or a different part is recorded by a manipulator [S65].

Next, the manipulator moves from the office to the inside of the clean room [S66] and modifies and updates the file in the substrate processing device #2 based on the output comparison result or memo [S67]. Next, the manipulator moves from the inside of the clean room to the office [S68] and determines whether the file update is performed accurately or not. When it is determined that the file update is not performed accurately, the manipulator moves again to the inside of the clean room and performs the modification of the file. When it is determined that the file update is performed accurately, the processing is returned to Operation S62 and then the comparison and modification are performed on a file of a next substrate processing device, for example, the substrate processing device #3.

In this manner, in the related art, while it is possible to compare the two files in the management apparatus, it is impossible to simultaneously compare three or more files. Accordingly, when there are three or more comparison target substrate processing devices, much time is spent updating the files, the original substrate processing is not started, and it causes a decrease in an operation rate of the device.

SUMMARY OF THE INVENTION

The present invention provides a management apparatus in which a difference between pieces of device information of substrate processing devices is determined and the device information is updated, a substrate processing system and a non-transitory computer-readable recording medium.

According to an aspect of the present invention, there is provided a management apparatus connected to a substrate processing device configured to store a device information for processing a substrate, the management apparatus including:

a manipulation & display unit including a user interface for selecting a reference device information, and configured to display: a difference between the device information obtained from the substrate processing device and the reference device information selected via the user interface; a content of the reference device information; and a content of the device information, and further configured to receive a command for modifying the device information; and a control unit configured to modify the device information based on the command received from the manipulation & display unit and configured to transmit a modified device information to the substrate processing device.

According to another aspect of the present invention, there is provided a substrate processing system including:

a substrate processing device configured to store a device information for processing a substrate; and a management apparatus connected to the substrate processing device, the management apparatus including:

a manipulation & display unit including a user interface for selecting a reference device information, and configured to display: a difference between the device information obtained from the substrate processing device and the reference device information selected via the user interface; a content of the reference device information; and a content of the device information, and further configured to receive a command for modifying the device information; and a control unit configured to modify the device information based on the command received from the manipulation & display unit and configured to transmit a modified device information to the substrate processing device.

According to still another aspect of the present invention, there is provided a method of updating a device information, including:

(a) determining a difference between a device information for processing a substrate obtained from a substrate processing device and a reference device information;

(b) displaying the difference, a content of the reference device information and a content of the device information;

(c) receiving a command for modifying the device information; and (d) modifying the device information based on the command and transmitting a modified device information to the substrate processing device.

According to yet another aspect of the present invention, there is provided a non-transitory computer-readable recording medium storing therein a device information update program causing a computer to perform:

(a) determining a difference between a device information for processing a substrate obtained from a substrate processing device and a reference device information;

(b) displaying the difference, a content of the reference device information and a content of the device information;

(c) receiving a command for modifying the device information; and (d) modifying the device information based on the command and transmitting a modified device information to the substrate processing device.

BRIEF DESCRIPTION OF THE DRAWINGS

FIG. 4 is a view illustrating an example of substrate processing device file information according to an embodiment of the present invention.

FIG. 5 is a view illustrating an example of comparison file management information according to an embodiment of the present invention.

FIG. 6 is a view illustrating an example of file comparison result information according to an embodiment of the present invention.

FIG. 10 is a view illustrating an example of file comparison result information according to an embodiment of the present invention.

FIG. 11A illustrates an example of file comparison result information according to an embodiment of the present invention and FIG. 11B illustrates an example of file comparison result information according to an embodiment of the present invention.

FIG. 12A illustrates an example of file comparison result information according to an embodiment of the present invention and FIG. 12B illustrates an example of file comparison result information according to an embodiment of the present invention.

FIG. 13A illustrates an example of file comparison result information according to an embodiment of the present invention and FIG. 13B illustrates an example of file comparison result information according to an embodiment of the present invention.

DETAILED DESCRIPTION OF THE PREFERRED EMBODIMENTS

Figure 1:
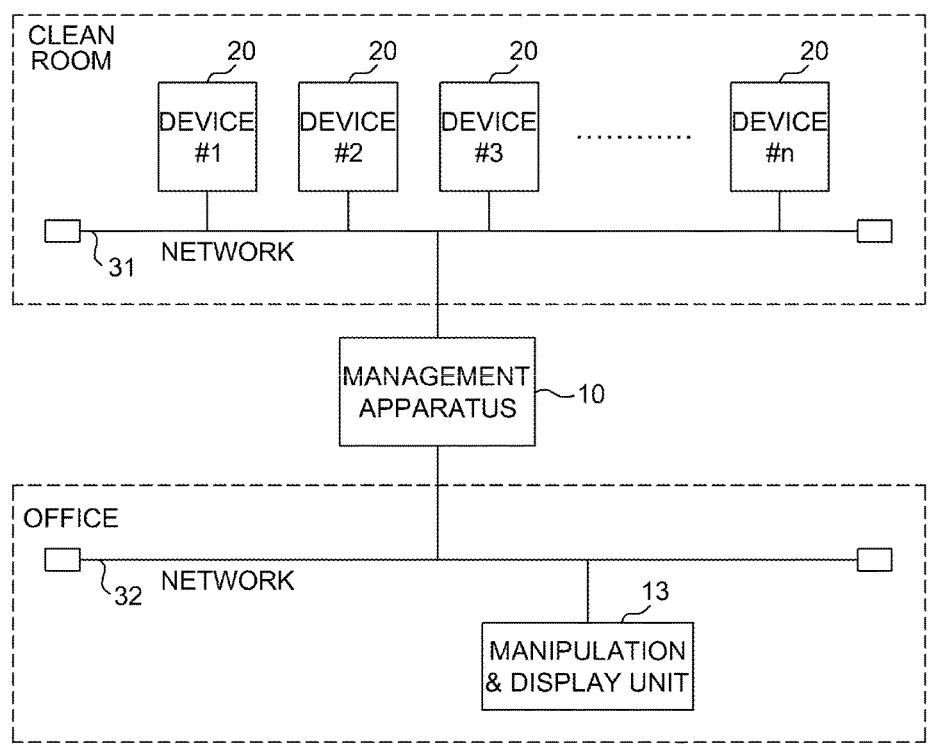
FIG. 1 is a configuration diagram illustrating a substrate processing system according to an embodiment of the present invention.

An embodiment of the present invention will be described with reference to FIGS. 1 through 8. First, an overview of a configuration of a substrate processing system will be described with reference to FIG. 1. FIG. 1 is a configuration diagram illustrating the substrate processing system according to the embodiment of the present invention. In FIG. 1, the substrate processing system includes a plurality of substrate processing devices 20 (device #1 through device #n), a management apparatus 10, as a manipulation & display unit 13, the manipulation & display unit 13 including a graphical user interface (GUI), which is a part of the management apparatus 10, a network 31 which connects the plurality of substrate processing devices 20 to the management apparatus 10 and a network 32 which connects the management apparatus 10 to the manipulation & display unit 13. Further, as illustrated in FIG. 1, the management apparatus 10 and the manipulation & display unit 13 may be separately configured.

Each substrate processing device 20 is installed in a clean room and the manipulation & display unit 13 is installed in an office having an atmosphere of which cleanliness is lower than that of the clean room. The management apparatus 10 is installed outside the clean room or office. Alternatively, the management apparatus 10 may be installed in the office. In this case, it is unnecessary to connect the management apparatus 10 to the manipulation & display unit 13 through the network and the management apparatus 10 may be directly connected to the manipulation & display unit 13.

Figure 3:
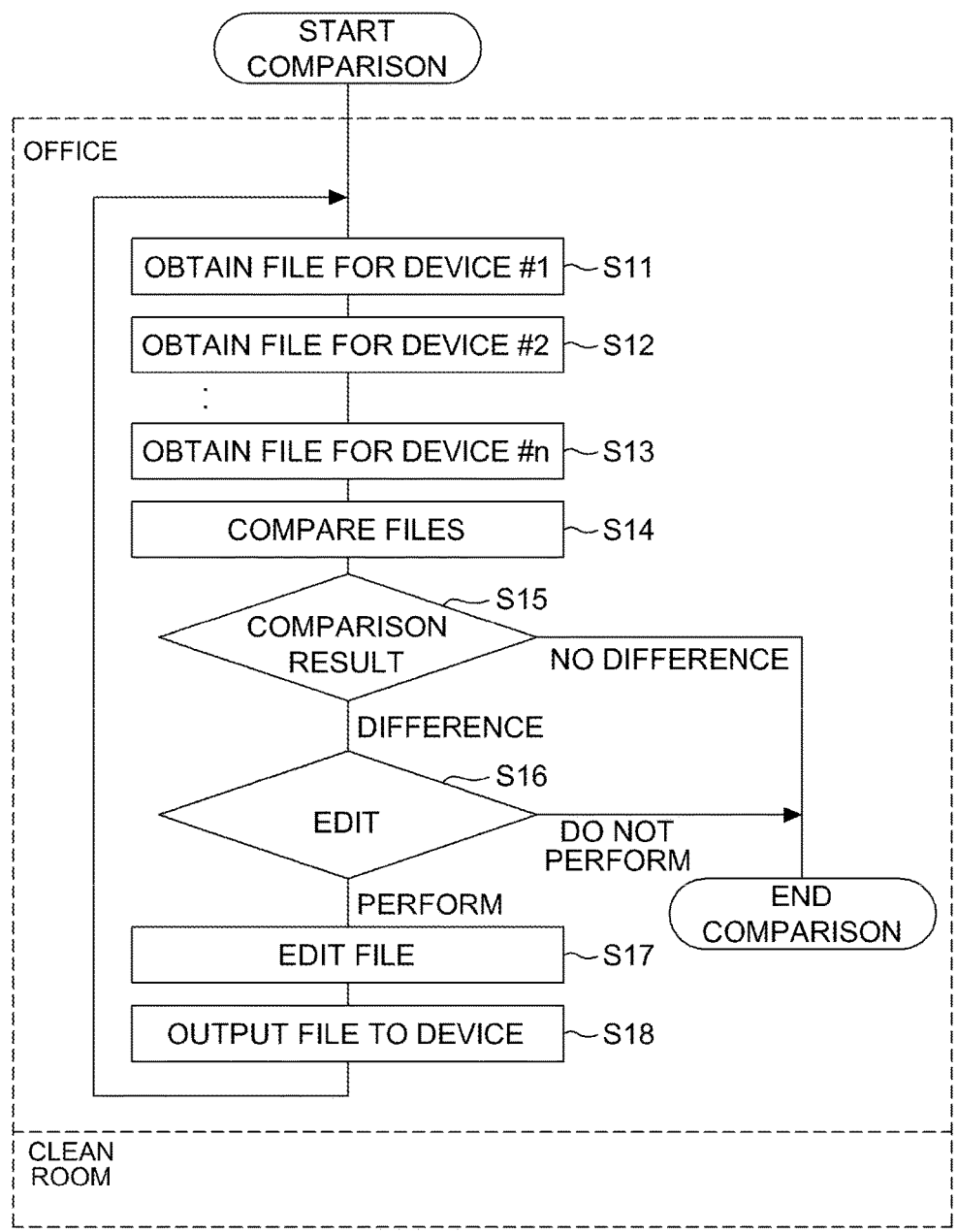
FIG. 3 is a flowchart for schematically describing a file comparing and updating process according to an embodiment of the present invention.

Next, a file comparing and updating process according to the present embodiment will be schematically described with reference to FIG. 3. FIG. 3 is a flowchart for schematically describing the file comparing and updating process according to the present embodiment. A file in the present embodiment is device information on the substrate processing device 20 for processing a substrate. First, for example, when the comparing and updating process is performed on the file, a user interface for selecting a master file is displayed on a manipulation screen of the manipulation & display unit 13, a manipulator determines a file (referred to as the master file) which is a comparison reference through the user interface and selects the master file through the manipulation & display unit 13 of the management apparatus 10. The management apparatus 10 performs a comparison based on the master file. In the example in FIG. 3, a predetermined file of the substrate processing device #1 20 is selected by the manipulator as the master file. The master file is a file in which reference device information which is a reference of the device information is stored.

In FIG. 3, first, the management apparatus 10 obtains the master file (e.g., a file name is "recipe 1") selected by the manipulator from the substrate processing device #1 20 through the network 31 [S11]. Next, the management apparatus 10 obtains a file (referred to as a same name file) which has the same name as the master file from the substrate processing device #2 20 [S12]. In this manner, the management apparatus 10 sequentially obtains the same name file from each device, and finally obtains it from the substrate processing device #n 20 [S13]. In this manner, the management apparatus 10 obtains the same name file from all the substrate processing devices 20 under the management apparatus 10. Here, files having different names as well as the files having the same names may be compared in batches. For example, files having a similar file name may be configured to be compared in batches.

Next, the management apparatus 10 compares content of the same name file obtained from the device #2 to the device #n to content of the master file in parallel [S14]. When a comparison result is that there is no difference, that is, when there is no difference in Operation S15, the main processing (the file comparing and updating process) ends. When the comparison result is that there is a difference, that is, when there is a difference in Operation S15, the management apparatus 10 determines whether or not the manipulator performs an editing command from the manipulation & display unit 13 of the management apparatus 10 [S16]. When there is no editing command in Operation S16, the main processing (the file comparing and updating process) ends. Further, presence of the editing command may be detected, for example, by asking whether the editing command is present through a dialog or the like displayed on a screen, or by managing the presence of the editing command according to time.

When there is an editing command in Operation S16, the management apparatus 10 performs the editing, that is, the modification of the same name file obtained from the device #2 to the device #n [S17], and outputs, that is, transmits, the modified file to the device #2 to the device #n through the network 31 [S18]. In the device #2 to the device #n, the same name file before the modification is updated by replacing the same name file before the modification with the modified file received from the management apparatus 10. The management apparatus 10 transmits the modified file to the device #2 to the device #n and then returns to Operation S11 and performs the file comparing and updating process based on a next master file (e.g., the file name is "recipe 2"). In this manner, in the present embodiment, since the management apparatus 10 has a file editing function, all manipulations by the manipulator are performed in the manipulation & display unit 13 of the management apparatus 10, that is, in the office.

Therefore, even when the number of the comparison target devices is three or more, for example, it is unnecessary to repeatedly move between the office and the clean room. Therefore, when the file comparing and updating process is performed, time is prevented from being wasted due to time spent performing a task that is not directly related, such as moving between the office and the clean room or the like. Further, since it is unnecessary to perform the editing process in the clean room, an atmosphere of the clean room can be expected to be maintained as a clean environment.

The substrate processing device 20 will be described. The substrate processing device 20 performs substrate processing, for example, a film forming process in which film forming is performed on a surface of the substrate, and stores various pieces of device information on the substrate processing device in the memory unit of the substrate processing device 20 as a file with a device information identifier (ID) which is an ID for identifying each piece of device information. The device information includes, for example, a substrate processing recipe including a sequence for performing the substrate processing and the like. Further, the recipe includes an alarm recipe or abort recipe that is executed when an error occurs during the performing of the substrate processing recipe. Further, the file includes a file for control parameters such as a pressure parameter, a temperature parameter, a gas flow rate parameter and the like used in the substrate processing recipe as well as the recipe. The device information includes various parameters such as the control parameters or the like.

Figure 2:
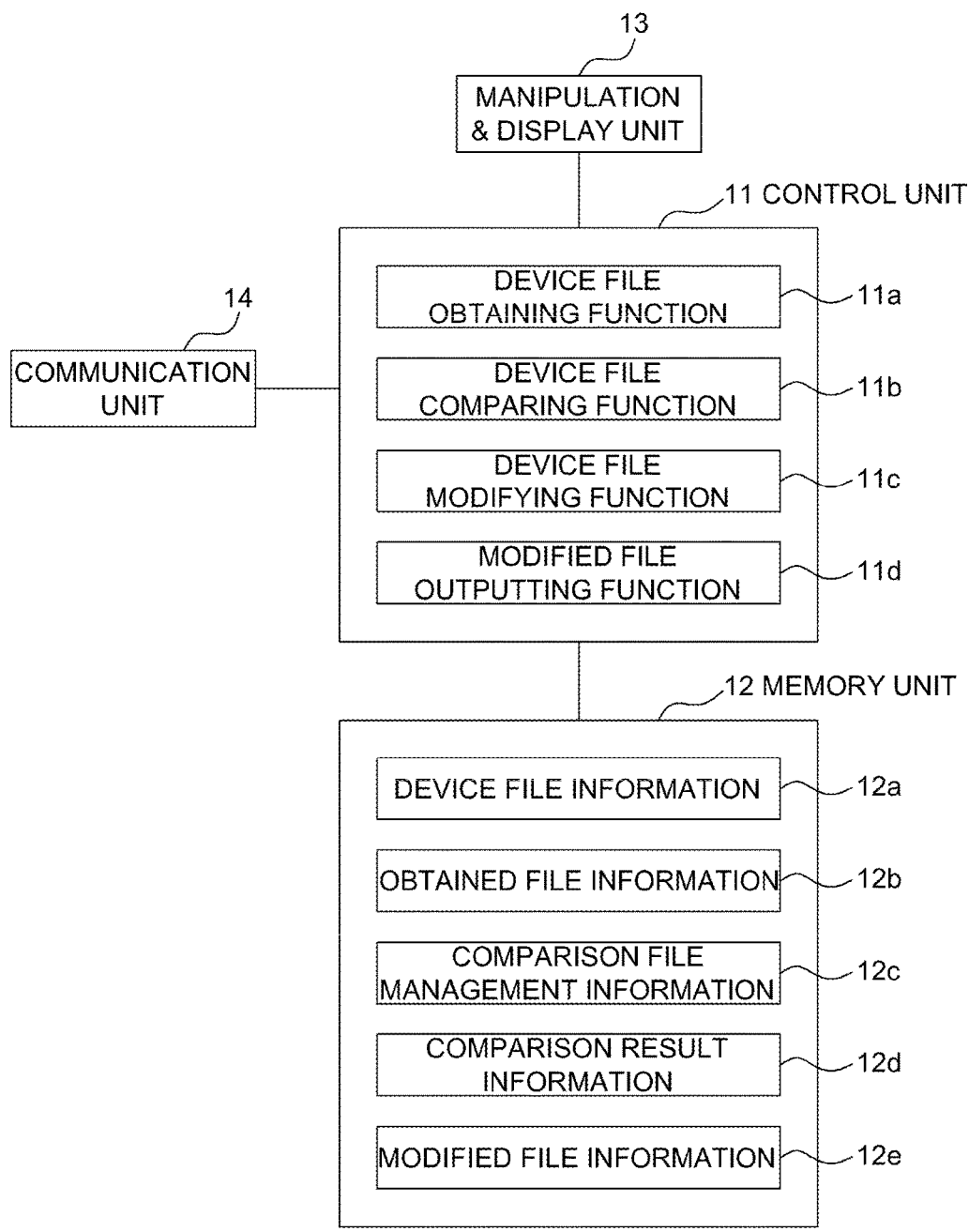
FIG. 2 is a configuration diagram illustrating a management apparatus according to an embodiment of the present invention.

The management apparatus will be described with reference to FIG. 2. FIG. 2 is a configuration diagram illustrating the management apparatus according to the embodiment of the present invention. As illustrated in FIG. 2, the management apparatus 10 includes a control unit 11, a memory unit 12, a manipulation & display unit 13 and a communication unit 14. The manipulation & display unit 13 includes a manipulation unit including a keyboard, a mouse or the like which receives various commands, data inputs or the like from the manipulator and a display unit including a liquid crystal display (LCD) or the like which displays various pieces of data. The manipulation unit and the display unit are configured separately from each other. The manipulation & display unit 13 is connected to the management apparatus 10 through the network 32 in the present embodiment as described above. The communication unit 14 is connected to the network 31 and performs communication between the substrate processing devices 20 connected to the network 31.

The memory unit 12 stores device file information 12*a*, obtained file information 12*b*, comparison file management information 12*c*, comparison result information 12*d*, and modified file information 12*e*.

[Device File Information 12*a*]

A configuration example of the device file information 12*a* according to the present embodiment is illustrated in FIG. 4. The device file information 12*a* stores file names of the files stored in all the substrate processing devices 20 under the management apparatus 10, that is, connected to the management apparatus 10 corresponding to device names of the substrate processing devices 20. The device file information 12*a* may be displayed on the manipulation & display unit 13. In the example of FIG. 4, the device file information 12*a* includes, for example, information having an effect in which the substrate processing device #1 20 of which the device name is "device #1" stores files of which the file names are "File 01" to "File nn." Further, a device ID which specifies the substrate processing device 20 may be used instead of the device name. Further, a file ID which specifies the file may be used instead of the file name.

[Obtained File Information 12b]

The obtained file information 12b is content information on the same name file having the same name as the master file obtained from each substrate processing device 20 in the above-described file comparing and updating process and includes content information on the master file. The obtained file information 12b is stored in correspondence with file content, the device name and the file name. The obtained file information 12b may be displayed on the manipulation & display unit 13.

[Comparison File Management Information 12c]

The comparison file management information 12c indicates on which substrate processing device 20 the file modification (editing) is performed in the above-described file comparing and updating process, that is, by identifying the substrate processing device 20 on which the file modification is performed and the substrate processing device 20 on which the file modification is not performed. The comparison file management information 12c may be displayed on the manipulation & display unit 13. A configuration example of the comparison file management information 12c according to the present embodiment is illustrated in FIG. 5. Information on whether the substrate processing device 20 stores the master file, the file name of the master file, and an edit flag (modify flag) which indicates whether or not the file modification is performed with the master file ("File 02" in the example of FIG. 5) corresponding to the device names of all substrate processing devices 20 under the management apparatus 10 storing the same name file is stored in the comparison file management information 12c. In the example of FIG. 5, the "File 02" is selected as the master file, the device is the substrate processing device 20 which stores the master file, and all the same name files stored in the device #2 to the device #n indicate a state in which the file modification is not performed (the edit flag is set to OFF).

[Comparison Result Information 12d]

A configuration example of the comparison result information 12d according to the present embodiment is illustrated in FIG. 6. The comparison result information 12d illustrates a result of the comparison of the master file and the same name file in the above-described file comparing and updating process. The comparison result information 12d may be displayed on the manipulation & display unit 13 as a file comparison screen (information comparison screen). The comparison result information 12d is displayed the device name of the substrate processing device 20 (master device) which stores the master file, the file name of the master file, the device name of the substrate processing device 20 which stores the same name file which has the same name as the master file, and the parameter value among the master file and the same name file to be compared between the substrate processing devices 20. In the example of FIG. 6, the device #1 which is the device name of the master device, the "recipe 1" which is the file name of the master file, the device #2 to the device #n, which are the device names of the substrate processing devices 20 which store the same name files, and the temperature setting values and pressure setting values among the parameters in the files of the "recipe 1" are illustrated.

In the example of FIG. 6, the temperature setting value of "recipe 1" of the master file of the device #1 is 300° C. and the pressure setting value thereof is 10,000 Pa. The temperature setting value of the same name file "recipe 1" of the device #2 is 295° C. and the pressure setting value thereof is 10,000 Pa. The temperature setting value of the same name file "recipe 1" of the device #3 is 300° C., and the pressure setting value thereof is 9,900 Pa. The temperature setting value of the same name file "recipe 1" of the device #n is 295° C., and the pressure setting value thereof is 10,000 Pa. Since the temperature setting values of the same name files "recipe 1" of the device #2 and the device #n are different from the temperature setting value 300° C. of the master file and the pressure setting value of the same name file "recipe 1" of the device #3 is different from the pressure setting value 10,000 Pa of the master file, parameter items ("temperature setting value" and "pressure setting value") that are different and the parameters (setting value, setting pressure and the like) that are different from those of the master file, for example, are underlined. Further, in order to clearly display the differences, as illustrated in FIG. 6, blinking or coloring may be displayed in addition to underlining the different parameters or parameter items. For example, a background color may be selected and displayed on the different parts, and a color may be selected and displayed on the parameter name or the parameter item name.

[Modified File Information 12e]

The modified file information 12e is file information (modified device information) on the result of the file modification in the above-described file comparing and updating process. The modified file information 12e may be displayed on the manipulation & display unit 13. For example, the modified file information 12e is a file in a state in which the temperature setting value of the same name file "recipe 1" of the device #2 is modified to 300° C. which is the temperature setting value of the master file in the above-described example of FIG. 6. When the modified file information 12e is transmitted to the device, the same name file "recipe 1" of the device is updated to the same content as the master file. Further, it is preferable to increase the visibility such as changing a display color of the modified parameter to a different color from the other parameters.

The control unit 11 controls the components of the above-described management apparatus 10 and includes a central processing unit (CPU) and a memory which stores operation programs of the control unit 11 as hardware components, and the CPU operates according to the operation programs. As illustrated in FIG. 2, the control unit 11 includes a device file obtaining function 11a, a device file comparing function 11b, a device file modifying function 11c, and a modified file outputting function 11d.

[Device File Obtaining Function 11a]

The control unit 11 registers and stores the file storing the predetermined substrate processing device 20 in the memory unit 12 as the master file according to a command from the manipulator, which is transmitted to the manipulation & display unit 13. Also, the control unit 11 obtains the same name files from the substrate processing devices 20 under the management apparatus 10 including the same name file as the master file [device file obtaining function 11a]. In this case, the device information on the master file is clearly displayed. For example, items which display the device information on the master file may be displayed by selecting a color for the background color.

Specifically, the control unit 11 performs a command (the same name file transmitting command) for the substrate processing device 20 having the same name file of the master file among the substrate processing devices 20 under the management apparatus 10 through the communication unit 14 with reference to the device file information 12a stored in the memory unit 12 so that the same name file is transmitted to the management apparatus 10. When the same name file transmitting command is received from the management apparatus 10, each of the substrate processing devices 20 transmits the same name file stored therein to the management apparatus 10 with the device name of the substrate processing device 20. The control unit 11 matches the same name file received from each substrate processing device 20 with the device name of the substrate processing device 20 and stores it in the memory unit 12 as the obtained file information 12b.

[Device File Comparing Function 11b]

Further, the control unit 11 obtains the same name file from each substrate processing device 20 under the management apparatus 10, then compares content of the obtained same name file to content of the master file stored in the memory unit 12, determines a difference between the obtained same name file and the master file, and clearly displays it [device file comparing function 11b]. For example, as the above-described file comparison screen in FIG. 6, the different parameter or parameter item is markedly displayed on the manipulation & display unit 13.

[Device File Modifying Function 11c]

Further, the control unit 11 switches the content of the obtained same name file to an edit mode in which the content is edited, that is, modified according to the command from the manipulator, which is transmitted to the manipulation & display unit 13. Also, the content of the obtained same name file is modified and a modified file (modified device information) is generated according to the command from the manipulator, which is transmitted to the manipulation & display unit 13 [device file modifying function 11c]. When the obtained content of the same name file is modified, the control unit 11 sets the edit flag in the above-described comparison file management information 12c in FIG. 5 from OFF to ON.

For example, as illustrated in FIG. 6, in a state in which a difference between the obtained same name file and the master file is displayed, a mouse configuring the manipulation & display unit 13 is moved at a position of the parameter of the same name file displayed as the difference, a context menu is displayed by manipulating the mouse, and the file comparison screen is switched to the edit mode when an "Edit" button is selected from the displayed context menu as an editing unit. To turn off the edit mode, the context menu is displayed in the same manner, and the edit mode is turned off when an "Editing complete" button is selected from the displayed context menu.

Also, in the edit mode, the parameter of the same name file displayed as the difference from the master file is modified in the same way as the content of the master file based on the command from the manipulator, which is transmitted to the manipulation & display unit 13. For example, in FIG. 6, the temperature setting value, "295," of the same name file (recipe 1) of the device #2 is modified to "300" in the same manner as the master file. In this case, it is preferable to clarify that the editing is completed such as by changing the colors before and after the editing. Further, although the manipulator may enter a value of "300" through the manipulation & display unit 13, a "Same modification" button which instructs the same type of modification as in the master file may be displayed through the manipulation & display unit 13, and the parameter may be modified in the same manner as in the master file when the "Same modification" button is pushed. In this manner, it is possible to prevent an input error from being generated by the manipulator.

Further, the parameter of the same name file displayed as the difference from the master file may be modified to a different value from the content of the master file. In this manner, it is easy to perform fine adjustment of the parameter on each substrate processing device 20. Further, the control unit 11 may be configured to automatically modify the obtained parameter of the same name file in the same manner as in the content of the master file without a command from a controller. In this manner, it is easy to modify the parameter in the same manner as in the content of the master file.

[Modified File Outputting Function 11d]

Further, the control unit 11 outputs the same name file modified in the edit mode to the substrate processing device 20 according to the command from the manipulator, which is transmitted to the manipulation & display unit 13 [modified file outputting function 11d]. In this case, the control unit 11 may determine whether the modification of the same name file in the edit mode is completed or not by the above-described comparison file management information 12c. Specifically, the management apparatus 10 transmits the same name file, which is modified in the edit mode, to the substrate processing device 20 in which the same name file has been stored before the modification. The substrate processing device 20 which receives the modified same name file updates by replacing the same name file before the modification stored in the substrate processing device 20 with the same name file after the modification.

Further, when the management apparatus 10 transmits the modified same name file to the substrate processing device 20, the management apparatus 10 may perform the individual transmission in which the modified same name file is transmitted to only the selected substrate processing device 20 or may perform the batch transmission in which the modified same name file is transmitted to all of the substrate processing devices 20 including a plurality of modified same name files based on the command from the manipulator, which is transmitted to the manipulation & display unit 13.

When the individual transmission is performed, the manipulator selects the substrate processing device 20 including the modified file which is individually transmitted from the manipulation & display unit 13. For example, the context menu is displayed at a position of the device name of the substrate processing device 20 of the transmitter, for example, at a position of the device #2 on the file comparison screen illustrated in FIG. 6, and the modified file is transmitted to the device when a "Send" button is clicked and selected from the displayed context menu.

Further, when the batch transmission is performed, the manipulator selects an effect of the batch transmission from the manipulation & display unit 13. For example, the context menu is displayed on the file comparison screen illustrated in FIG. 6, and all the modified files are sequentially transmitted to the substrate processing devices 20 including each modified file when a "Send all" button is clicked and selected from the displayed context menu. For example, in FIG. 6, the modified file "recipe 1" is sequentially transmitted to the device #2 to the device #n.

(File Comparing and Updating Process)

Figure 7:
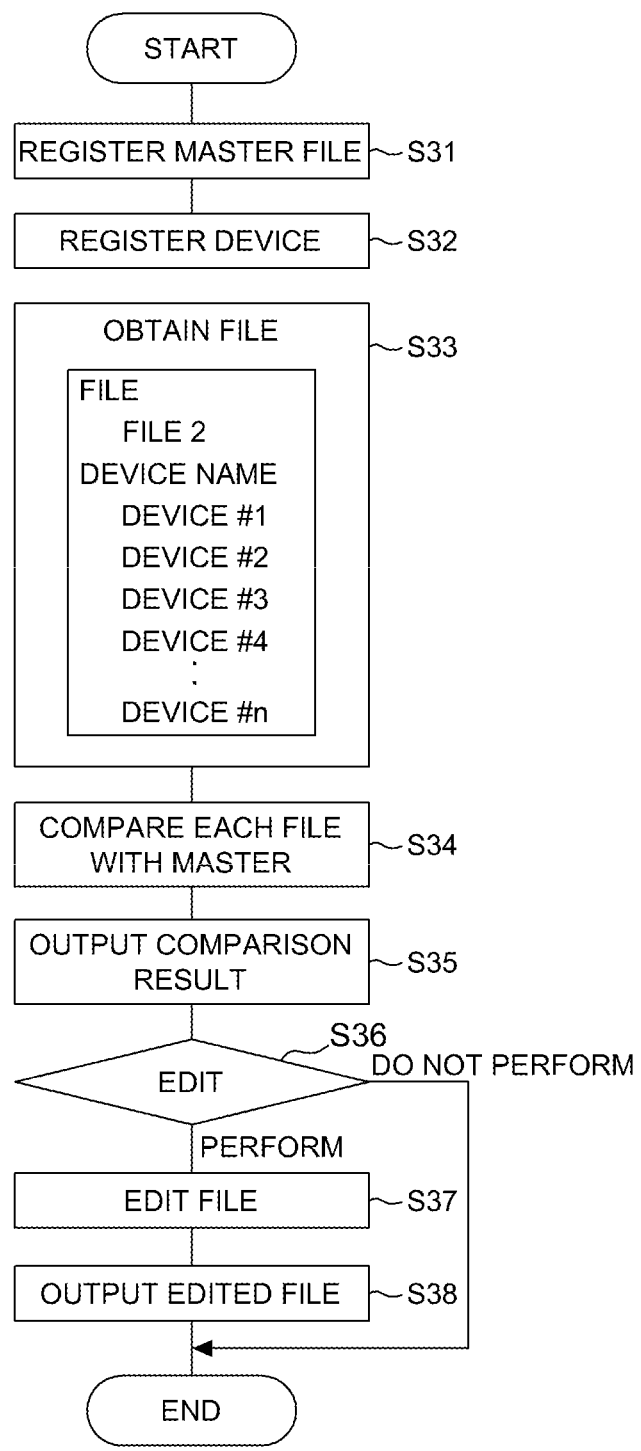
FIG. 7 is a flowchart for describing a file comparing and updating process according to an embodiment of the present invention.
Figure 8:
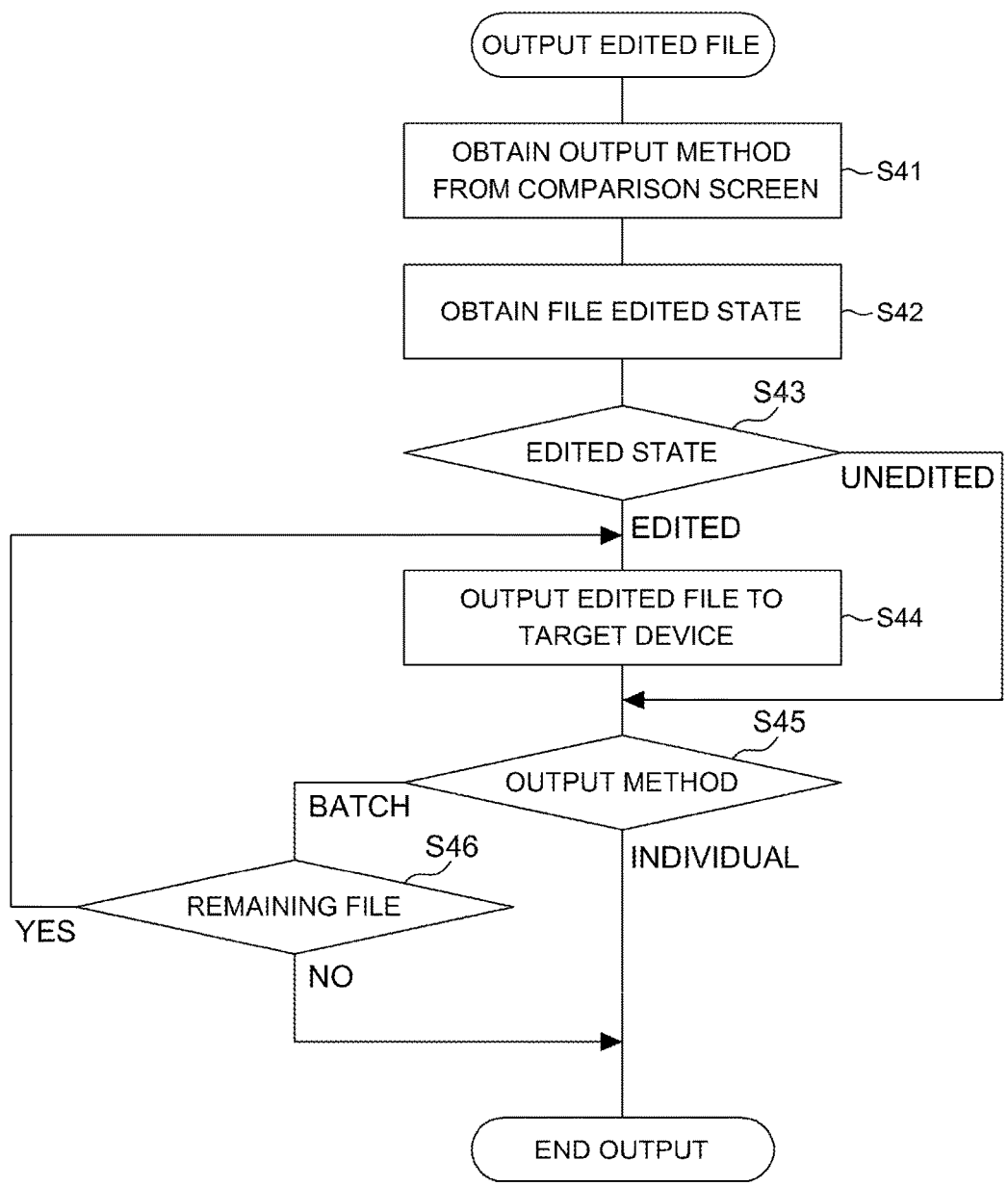
FIG. 8 is a flowchart for describing an edit file outputting process in the flowchart of FIG. 7.
Figure 9:
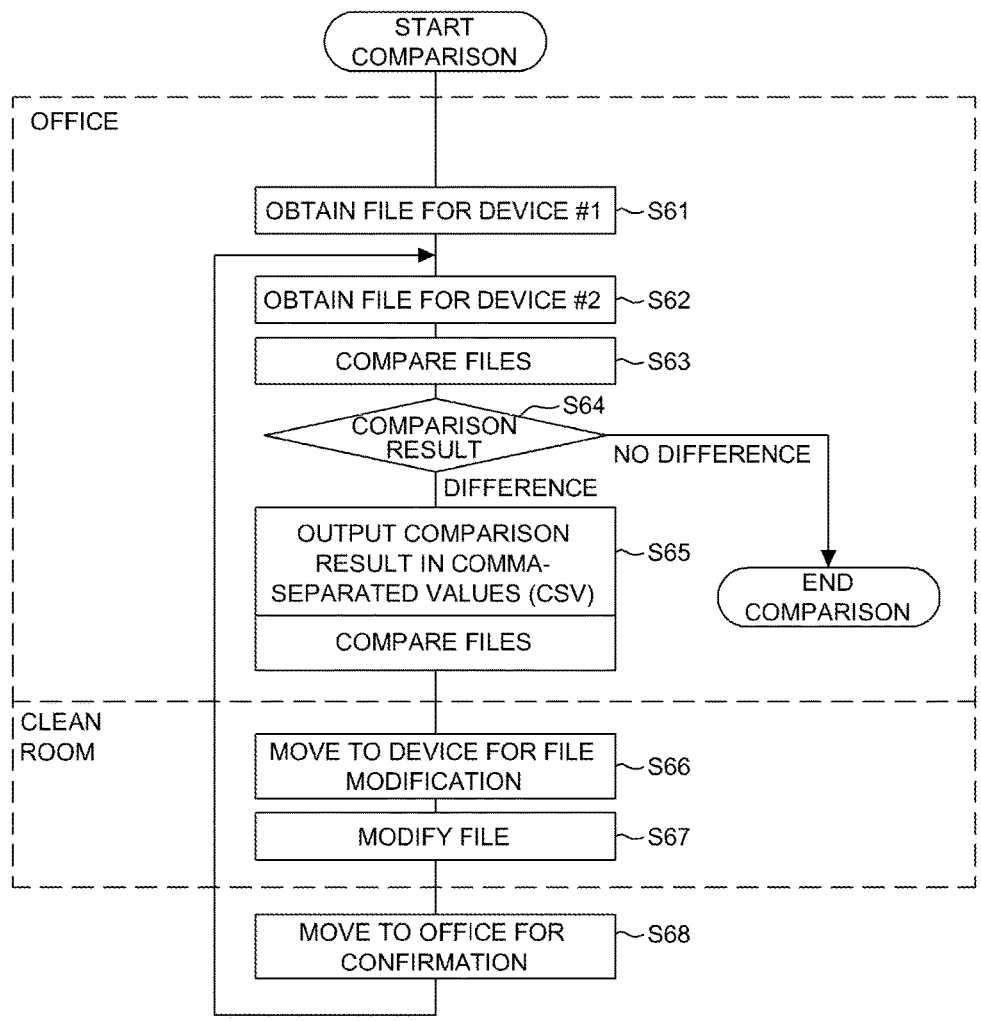
FIG. 9 is a flowchart for describing a file comparing and updating process according to related art.

Next, the file comparing and updating process of the management apparatus will be described with reference to FIGS. 7 and 8. FIG. 7 is a flowchart for describing the file comparing and updating process according to the present embodiment. FIG. 8 is a flowchart for describing an edit file outputting process in the flowchart of FIG. 7. In the file comparing and updating process, operations of the management apparatus 10 are controlled by the control unit 11.

First, the management apparatus 10 registers and stores a predetermined file stored in a predetermined substrate processing device 20 as a master file to the memory unit 12 according to the command from the manipulator, which is transmitted to the manipulation & display unit 13 [S31 in FIG. 7]. Also, the device name of the substrate processing device 20 having the same name file which has the same name as the master file is determined as the substrate processing device 20 under the management apparatus 10 based on the device file information 12*a* stored in the memory unit 12 and registered and stored in the memory unit 12 [S32].

Then, the management apparatus 10 obtains the same name file from the registered device name of the substrate processing device 20, that is, the substrate processing device 20 having the same name file, matches it with the device name of each substrate processing device 20, and stores it in the memory unit 12 as the obtained file information 12*b* [S33]. In the example of FIG. 7, the master file is a file "File 02" stored in the substrate processing device #1 20.

Then, the management apparatus 10 compares the content of the same name file of the device #2 to the device #n obtained in Operation S33 to the content of the master file of the device [S34], and outputs the difference between the obtained same name file and the master file. for example, as illustrated in FIG. 6, the different parameter or parameter item is markedly displayed on the manipulation & display unit 13 [S35]. Here, since the recipe file including the substrate processing recipe or the parameter file has many items and all the items are not actually displayed on one screen, all the items may be seen by scrolling the screen. However, when the different parts are uneven, an amount of operations is increased, and the task of specifying the different parts itself is time-consuming. Further, when the screen is scrolled in the edit mode state, parameters which need not be set may be changed due to an operating error. Thus, it is necessary to appropriately display the parameter or parameter item displayed on a manipulation screen illustrated in each of FIGS. 10 and 11A through 13B to be described below. Accordingly, the operability may be improved by screen control to be described below and thus the editing of the different parameter or parameter item may be performed.

Here, FIG. 10 will be described. FIG. 10 is a view illustrating an example in which only the different parameter or parameter item is displayed in Operation S35 of FIG. 7. Although not illustrated, the files are compared in Operation S34, and a difference button is displayed at a predetermined place of the output screen when a comparison result output screen is displayed. Also, when the difference button is pushed, the screen illustrated in FIG. 10 is configured to be displayed. Further, only the different part may be preconfigured to be displayed in Operation S34. In this manner, when only the different part is displayed, the item to be modified is clarified, and thus the editing of the different parameter or parameter item may be performed.

Next, FIGS. 11A and 11B will be described. FIG. 11B illustrates an example in which a result excluding the device which need not be compared is displayed in Operation S35 of FIG. 7. The context menu is displayed at a position of the device name of the substrate processing device #3 20 that is to be hidden, for example, at a position of the device #3, on the file comparison result output screen of FIG. 11A, and the substrate processing device 20 [device #3] of the selected target is hidden when a "Hide" button is clicked and selected from the displayed context menu as a hiding unit. In this manner, as illustrated in FIG. 11B, the selected device #3 is hidden, and the positions of the device names of the device #4 and thereafter are filled in to the left and displayed. Accordingly, when the device #3 which need not be compared is configured to be hidden, the substrate processing devices 20 to be compared are clarified and thus the editing of the different parameter or parameter item may be performed.

Next, FIGS. 12A and 12B will be described. FIG. 12B illustrates an example in which a result in which a rearrangement is performed as a predetermined parameter (or parameter item) is displayed in Operation S35 of FIG. 7. The context menu is displayed at a position of the selected item "Setting Value" on the file comparison result output screen in FIG. 12A, and the file comparison result output screen is sequentially displayed from the substrate processing device #4 20 having the temperature setting value close to the temperature setting value 300° C. of the substrate processing device #2 20 having the master file is performed when a "Sort" button is clicked and selected from the displayed context menu as a sorting unit. Specifically, when an important parameter (or parameter item) is compared, the file comparison result output screen is sequentially displayed from the substrate processing device 20 having the parameter file close to the master file is performed. Thus, it is easy to determine whether the modification by a value of the important parameter value is required or not, and thus the operability of the parameter modification is improved.

Next, FIGS. 13A and 13B will be described. FIG. 13B illustrates an example in which a result in which a rearrangement is performed by modifying the master file is displayed in Operation S35 of FIG. 7. The context menu is displayed in the example in which the substrate processing device #2 20 is a switching target of the master file on the file comparison result output screen of FIG. 13A, and the modification of the master file is performed when a "Master" button is clicked and selected from the displayed context menu as a changing unit. In this case, the file comparison is performed again based on a new master file. In this case, when the "Master" button is selected, the flowchart is returned to the file comparison operation S34, the selected device of the master file is moved to a leftmost end thereof, and a result of the file comparison is displayed after the file comparison is performed [S35]. After the master file is switched to the device #2, each parameter obtained by the device #2 is set as a reference value. Also, as illustrated in FIG. 13B, the parameter comparison is performed again on the master file after the change and each parameter set in each recipe file, and comparison results are displayed.

In the present embodiment, since the master file is configured to be arbitrarily selected, when the parameter comparison is performed in batches, for example, during the setup of the substrate processing device 20, the setup work is efficiently performed by setting the parameter that is used as the pre-delivered substrate processing device 20 to the master file. Further, because the master file is configured to be arbitrarily changed, when the parameter change is performed according to a film type change or process change deforms the substrate processing device 20, for example, using the substrate processing device 20, the parameter to be changed may be accurately displayed by setting the parameter that is used as the pre-delivered substrate processing device 20 to the master file.

In the present embodiment, since the recipe file or parameter file including the substrate processing recipe has many items, it is difficult to identify the item to be modified. However, since the different parameter or parameter item is displayed on the manipulation screen, setting errors of the parameter may be maximally suppressed. Further, reduced setup time may be expected in accordance with the modified operation when the parameter used as the pre-delivered substrate processing device 20 is set to the master file.

The file comparison result displaying functions illustrated in FIGS. 10A through 13B are easily combined. For example, as illustrated in FIGS. 12A and 12B, a "Sort" action is performed with a predetermined parameter and it is determined whether the parameter modification is required or not. Then, the substrate processing device 20 having the same parameter value as illustrated in FIGS. 11A and 11B is hidden with a "Hide" button. After the manipulation is repeated a predetermined number of times, the parameter modification may be performed in Operation S36. Further, before the repeating of the above manipulation, the different parameter or parameter item may be displayed as illustrated in FIG. 10. Further, before the repeating of the above manipulation, the switching of the master file may be performed as illustrated in FIGS. 13A and 13B.

Next, the management apparatus 10 determines whether or not it is in the edit mode state in which the obtained content of the same name file is modifiable [S36]. It is determined whether or not the edit mode will be entered according to the command from the manipulator, which is transmitted to the manipulation & display unit 13 as described above. In Operation S36, when it is determined that the content is not in the edit mode state ("Do not perform" in S36), the main processing (file comparing and updating process) ends. In Operation S36, when it is determined that the content is in the edit mode state ("Perform" in S36), the editing of the obtained same name file is performed, that is, the obtained content of the same name file is modified according to the command from the manipulator, which is transmitted to the manipulation & display unit 13 [S37]. When the obtained content of the same name file is modified, the control unit 11 sets the edit flag in the comparison file management information 12c of FIG. 5 from OFF to ON.

Next, the management apparatus 10 outputs the same name file modified in the edit mode to the substrate processing device 20 [S38] and the main processing (file comparing and updating process) ends according to the command from the manipulator, which is transmitted to the manipulation & display unit 13.

Next, the modified file outputting process in Operation S38 will be described with reference to FIG. 8. First, the management apparatus 10 obtains information on an output method according to the command from the manipulator, which is transmitted to the manipulation & display unit 13. That is, the management apparatus 10 obtains information on whether the modified file is output in batches or is individually output to the substrate processing device 20 [S41]. As described above, the batch output is selected when a "Transmit all" button is selected from the context menu displayed on the file comparison screen as illustrated in FIG. 6, and the individual output is selected when the "Transmit" button is selected from the displayed context menu.

Next, the management apparatus 10 obtains the edit state of the same name file of each substrate processing device 20, that is, information on whether the modification of the file of each substrate processing device 20 is completed or not from the comparison file management information 12c of FIG. 5 [S42].

Then, the management apparatus 10 determines whether the modification of the same name file of each substrate processing device 20 obtained in Operation S42 is completed or not [S43]. When it is determined that the modification of the same name file is completed [S43], the modified file is output to the substrate processing device 20 including the same name file when an "Edited" button is selected [S44], and the process transitions to Operation S45. When it is determined that the modification of the same name file is not completed [S43], the modified file is not output to the substrate processing device 20 including the same name file when an "Unedited" button is selected, and the process transitions to Operation S45.

In Operation S45, the management apparatus 10 determines whether the output method obtained in Operation S41 is a batch output method or an individual output method [S45]. When it is determined that the output method is individually performed ["Individual" in S45], the main processing (the edit file outputting process) ends.

When it is determined that the output method is the batch output method ["Batch" in S45], it is determined whether or not a file in which the modification is completed and the output is not completed remains in the comparison file management information 12c of FIG. 5, that is, whether or not the substrate processing device 20 having the same name file in which the modification is completed and the output is not completed remains [S46]. When it is determined that no file in which the modification is completed remains ["No" in S46], that is, when no substrate processing device 20 having the same name file in which the modification is completed and the output is not completed remains, the main processing (the edit file outputting process) ends. When it is determined that a file in which the modification is completed remains ["Yes" in S46], that is, when a substrate processing device 20 having the same name file in which the modification is completed and the output is not completed remains, the flowchart returns to Operation S44, and the same name file is output to the substrate processing device 20.

For example, when the output method is the batch output method and all the edit flags of the device #2 to the device #n are ON in the comparison file management information 12c of FIG. 5, a modified file of the device #2 is transmitted to the device #2, a modified file of the device #3 is transmitted to the device #3, a modified file of the device #4 is transmitted to the device #4, and finally a modified file of the device #n is transmitted to the device #n. In this manner, the modified file of each substrate processing device 20 is transmitted to the substrate processing device 20 including the modified file.

At least the following effects are obtained according to the present embodiment.

(a) Since files stored in three or more substrate processing devices which perform the same substrate processing are simultaneously compared, efficiency can be improved compared to comparison of two devices.

(b) Since the management apparatus modifies the content of the same name file of the substrate processing device and instructs output of the modified same name file to the substrate processing device, the efficiency of the file updating process can be improved.

(c) Since the management apparatus modifies the content of the same name on the file comparison screen (illustrated in FIG. 6) and instructs output of the modified same name file to the substrate processing device, the efficiency of the file updating process can be further improved.

(d) Since the visibility is improved, for example, by changing a display color of a different part from the master file of the same name file on the file comparison screen (illustrated in FIG. 6), it is easy for the manipulator to detect the different part from the master file.

(e) Since the visibility is improved, for example, by changing a display color of a modified part on the modified file information display screen, it is easy for the manipulator to detect the modified part.

(f) Only a different part (different parameter or parameter item) may be displayed on the file comparison screen (illustrated in FIG. 10). Further, since the visibility is improved, for example, by changing the display color of the different part from the master file of the same name file, it is easy for the manipulator to detect the different part from the master file.

(g) Further, as illustrated in FIG. 11B, the result excluding the device which need not be compared may be displayed on the file comparison screen. Further, since the visibility is improved, for example, by changing the display color of the different part from the master file of the same name file, it is easy for the manipulator to detect the different part from the master file.

(h) Further, as illustrated in FIG. 12B, the result in which the rearrangement is performed with a predetermined parameter (or the parameter item) may be displayed on the file comparison screen. Further, since the visibility is improved, for example, by changing the display color of the different part from the master file of the same name file, it is easy for the manipulator to detect the different part from the master file. It is easy to determine whether or not the modification for the predetermined parameter by the parameter value is required, and thus the operability of the parameter modification is improved. Further, it is possible to determine the number of devices of which the content is different from the setting content of the device which stores the master file when the rearrangement is performed with the predetermined parameter item.

(i) Further, as illustrated in FIG. 13B, since the visibility is improved, for example, by changing the display color of the different part from the master file of the same name file, it is easy for the manipulator to detect the different part from the master file. Further, after the batch comparison is performed on the files, it is possible to perform the batch comparison on the files at a different viewpoint by switching the master file. For example, when some items of the device file selected as the master file are different from the items of the comparison target device, the selection of the master file can be invalid. Thus, the substrate processing device of the comparison target of the item is clarified by switching the master file.

(j) Further, according to the present invention, it is possible to contribute to a faster start (setup) according to the device parameter adjustment time reduction. For example, when a new device is installed or the parameter is set based on the film type change of the preinstalled device, since it is possible to determine the other pre-installed device of the same film type and the parameter setting content and perform the editing of the different part in batches with a group, it is possible to reduce time spent repeating the comparison between the devices, performing a memo operation of the different part, moving from the device in the office to the device in the clean room, and editing the file, and as a result, it is possible to contribute to reduction of time according to the reduction of the difference of the same film type devices.

(k) Further, according to the present invention, it is possible to quickly detect the different part of the device parameter according to a version difference of software. Since there are cases in which the version of the software is different according to release time, the setting content of the parameter may be changed according to the version of the software even when the substrate processing device is the same film type device. Thus, in the present embodiment, it is possible to quickly detect the different part of the parameter between the devices by performing the batch comparison on the device file, and as a result, the difference between the devices can be reduced.

(l) Further, according to the present invention, it is possible to quickly detect factors in which the production results are different. For example, even if the substrate processing device is the same film type device, there are cases in which differences occur in the production results. In this case, the difference may appear in the setting of the production recipe of the device, it is possible to quickly detect the difference of the setting of the recipe by performing the batch comparison of the device file in the present embodiment, and as a result, it is possible to contribute to improvement of the production efficiency.

Further, the present invention is not limited to the above embodiment, but may be variously modified without departing from the scope of the invention.

Other Embodiments

When there is a change command of the master file, the file comparison is performed again and the change display of the file comparison screen is performed when the file selected according to the changing command is displayed as the master file at a leftmost end in the embodiment [S34 of FIG. 7][S35 of FIG. 7]. The present invention is not limited thereto, and the main processing may return to Operation S31 of FIG. 7 according to the change command of the master file in another embodiment.

Further, although it is described that the substrate processing recipe file is used as the master file in the embodiment, a file other than the substrate processing recipe, for example, a parameter file having parameters, may be used.

Further, although the manipulation & display unit of the management apparatus is configured with a separate manipulation unit and display unit in the embodiment, the manipulation unit and the display unit may be configured to be integrated, for example, using a touch panel.

Further, although the master file is obtained from the substrate processing device under the management apparatus in the embodiment, it may be configured to be obtained from a device other than the substrate processing device. For example, the master file may be generated as a reference of the substrate processing by the management apparatus or the computer, and stored in the memory unit of the management apparatus.

Further, the management apparatus need not be installed outside the office or clean room, and may be installed, for example, in the office. Further, in the management apparatus, the memory unit, the control unit, the manipulation unit and the display unit need not be integrally installed, and may be separately installed. Further, although the file comparison screen and the like are displayed on the management apparatus in the embodiment, the file comparison screen and the like may be displayed on the substrate processing device and may be configured to perform various commands given by the manipulator from the manipulation & display unit of the substrate processing device.

The control unit, manipulation & display unit or memory unit of the management apparatus described in the embodiment need not be used exclusively by the management apparatus, and may be implemented using a general computer system such as a computer or the like. For example, the control unit for performing the above-described process may be configured when the program is installed on the non-transitory computer-readable recording medium (a flexible disk, CD-ROM, USB memory or the like) which stores the program (the file comparing and updating process program in the embodiment) for performing the above-described process to the general purpose computer. For example, the control unit for performing the file comparing and updating process program described in the embodiment, or the like may be implemented in the substrate processing device itself.

Further, a means for supplying the program (the file comparing and updating process program) which performs the above-described process may be arbitrarily selected. As described above, the program may be supplied, for example, through communication lines, communication networks, communication systems and the like, in addition to being supplied through a predetermined non-transitory computer-readable recording medium. In this case, for example, the program may be published in a bulletin of the communication network, and supplied through the network. Also, in this manner, the provided program is started, and the above-described process may be performed when the process is performed in the same manner as the other application programs under the control of the operating system (OS) of the management apparatus.

Further, the present invention may be applied to an apparatus for processing a glass substrate such as an LCD manufacturing apparatus or another substrate processing device in addition to a semiconductor manufacturing apparatus. Content of the substrate processing process may include an annealing process, an oxidation process, a diffusion process, an etching process, an exposure process, a lithography process, a coating process, a molding process, a development process, a dicing process, a wire bonding process, an inspection process and the like as well as a chemical vapor deposition (CVD) process, a physical vapor deposition (PVD) process, an epitaxial (EPI) deposition process and a film forming process for forming an oxide film, a nitride film, a metal-containing film and the like.

According to the above configuration, a difference between pieces of device information of substrate processing devices is determined, the determined difference between the pieces of the device information is displayed on a manipulation screen, and thus the updating of the device information can be performed.

Preferred Embodiments of the Present Invention

Hereinafter, preferred embodiments according to the present invention are supplementarily noted.
<Supplementary Note 1>
According to an aspect of the present invention, there is provided a management apparatus connected to a substrate processing device configured to store a device information for processing a substrate, the management apparatus including:
a memory unit configured to store a reference device information;
a manipulation & display unit configured to receive a command from an operator and to display informations; and
a control unit configured to perform a control process including: obtaining the device information from the substrate processing device; displaying a content of the device information and a content of the reference device information based on the device information obtained from the substrate processing device and the reference device information stored in the memory unit; modifying the device information based on a command for modifying the device information received via the manipulation & display unit based on a difference between the device information and the reference device information; and transmitting a modified device information to the substrate processing device.
<Supplementary Note 2>
In the management apparatus of Supplementary note 1, preferably, the device information includes a recipe information including a parameter for processing a substrate with the substrate processing device.
<Supplementary Note 3>
In the management apparatus of any one of Supplementary notes 1 and 2, preferably, the reference device information is stored in the memory unit according to a type of the device information and the control unit is further configured to perform the control process according to the type of the device information.
<Supplementary Note 4>
In the management apparatus of any one of Supplementary notes 1 through 3, preferably, the control unit is further configured to modify the device information being equal to the reference device information.
<Supplementary Note 5>
In the management apparatus of any one of Supplementary notes 1 through 4, preferably, the manipulation & display unit is further configured to receive a command for modifying the device information via the device information comparison screen.
<Supplementary Note 6>
According to another aspect of the present invention, there is provided a substrate processing system including:
a substrate processing device configured to store a device information for processing a substrate; and
a management apparatus connected to the substrate processing device, the management apparatus including:
a memory unit configured to store a reference device information;
a manipulation & display unit configured to receive a command from an operator and to display informations; and
a control unit configured to perform a control process including: obtaining the device information from the substrate processing device; displaying a content of the device information and a content of the reference device information based on the device information obtained from the substrate processing device and the reference device information stored in the memory unit; modifying the device information based on a command for modifying the device information received via the manipulation & display unit based on a difference between the device information and the reference device information; and transmitting a modified device information to the substrate processing device.
<Supplementary Note 7>
In the substrate processing system of Supplementary note 6, preferably, the management apparatus is configured to obtain the device information from the substrate processing device based on a name of the reference device information stored in the memory unit and to display a parameter for processing a substrate included in the reference device information and a parameter for processing a substrate included in the device information on the device information comparison screen.
<Supplementary Note 8>
According to still another aspect of the present invention, there is provided a method of updating a device information, the method including:

(a) obtaining a device information for processing a substrate from a substrate processing device;

(b) comparing the device information with a reference device information being a reference for the device information;

(c) receiving a command for modifying the device information based on a difference between the device information and the reference device information;

(d) modifying the device information based on the command and transmitting a modified device information to the substrate processing device.

<Supplementary Note 9>

In the method of Supplementary note 9, preferably, the device information is obtained from the substrate processing device based on a name of the reference device information in (a).

<Supplementary Note 10>

In the method of any one of Supplementary notes 8 and 9, preferably, a content of the device information and a content of the reference device information are displayed via a device information comparison screen in (b).

<Supplementary Note 11>

In the method of Supplementary note 10, preferably, the command is received via the device information comparison screen in (c).

<Supplementary Note 12>

In the method of Supplementary note 10, preferably, a part modifying the difference in the modified device information is displayed on the device information comparison screen in (d).

<Supplementary Note 13>

In the method of any one of Supplementary notes 11 and 12, preferably, the difference in the device information or a modified part in the modified device information is displayed on the device information comparison screen in distinctive manner (a color is displayed by changing a color, blinking, or underlining.)

<Supplementary Note 14>

In the method of Supplementary note 13, preferably, the difference in the reference device information is displayed on the device information comparison screen in distinctive manner.

<Supplementary Note 15>

In the method of any one of Supplementary notes 13 and 14, preferably, differences before and after modification are displayed on the device information comparison screen in different colors.

<Supplementary Note 16>

According to still another aspect of the present invention, there is provided a method of displaying a device information, the method including:

(a) obtaining a device information for processing a substrate from a substrate processing device;

(b) comparing the device information with a reference device information being a reference for the device information;

(c) displaying a difference between the device information and the reference device information in distinctive manner.

<Supplementary Note 17>

In the method of Supplementary note 16, preferably, the difference in the reference device information is displayed in distinctive manner in (c).

<Supplementary Note 18>

In the method of any one of Supplementary notes 16 and 17, preferably, the difference in the device information is displayed in distinctive manner in (c).

<Supplementary Note 19>

According to still another aspect of the present invention, there is provided a device information update program causing a computer to perform:

(a) obtaining a device information for processing a substrate from a substrate processing device;

(b) comparing the device information with a reference device information being a reference for the device information;

(c) receiving a command for modifying the device information based on a difference between the device information and the reference device information;

(d) modifying the device information based on the command and transmitting a modified device information to the substrate processing device.

<Supplementary Note 20>

According to still another aspect of the present invention, there is provided a non-transitory computer-readable recording medium storing therein a device information update program causing a computer to perform:

(a) obtaining a device information for processing a substrate from a substrate processing device;

(b) comparing the device information with a reference device information being a reference for the device information;

(c) receiving a command for modifying the device information based on a difference between the device information and the reference device information;

(d) modifying the device information based on the command and transmitting a modified device information to the substrate processing device.

<Supplementary Note 21>

According to still another aspect of the present invention, there is provided a management apparatus connected to a substrate processing device configured to store a device information for processing a substrate, the management apparatus including:

a manipulation & display unit including a user interface for selecting a reference device information and comparing the device information with the reference device information, and configured to display: a difference between the device information obtained from the substrate processing device and the reference device information selected via the user interface; a content of the reference device information; and a content of the device information; and a control unit configured to perform a control process including: modifying the device information based on a command for modifying the device information received via the manipulation & display unit based on a difference between the device information and the reference device information and transmitting a modified device information to the substrate processing device.

<Supplementary Note 22>

In the management apparatus of Supplementary note 21, preferably, the management apparatus further includes a registration unit configured to register the substrate processing device based on the reference device information, and the registration unit is further configured to store a name of the substrate processing device, a selection information of a master file, a name of a comparison file and a edit flag indicating whether the comparison file is edited.

<Supplementary Note 23>

In the management apparatus of Supplementary note 21, preferably, the manipulation & display unit is further configured to display a device information comparison screen showing the content of the reference device information and the content of the device information, and further display a button for displaying only the difference on the device information comparison screen.

<Supplementary Note 24>

In the management apparatus of Supplementary note 21, preferably, the manipulation & display unit is further configured to display a device information comparison screen showing the content of the reference device information and the content of the device information, and further display an edit button on the device information comparison screen for switching the device information comparison screen to an edit mode editing the device information.

<Supplementary Note 25>

In the management apparatus of Supplementary note 21, preferably, the management apparatus is further connected to a plurality of substrate processing devices, and the manipulation & display unit is further configured to display a device information comparison screen showing the content of the reference device information and the content of device informations of the plurality of substrate processing devices and to further display: at least one of a first user interface for assigning a device information of one of the plurality of substrate processing devices as the reference device information; a second user interface for selecting at least one of the plurality of substrate processing devices to not display a device information of the at least one of the plurality of substrate processing devices; and a third user interface for sorting each device information of the plurality of substrate processing devices based on a predetermined parameter in the reference device information.

<Supplementary Note 26>

In the management apparatus of Supplementary note 25, preferably, the manipulation & display unit is further configured to compare each device information of the plurality of substrate processing devices to the reference device information when the device information of one of the plurality of substrate processing devices is assigned as the reference device information and display a content of each device information of the plurality of substrate processing devices and the reference device information.

<Supplementary Note 27>

According to still another aspect of the present invention, there is provided a substrate processing system including:

a substrate processing device configured to store a device information for processing a substrate; and a management apparatus connected to the substrate processing device, the management apparatus including:

a manipulation & display unit including a user interface for selecting a reference device information, and configured to display: a difference between the device information obtained from the substrate processing device and the reference device information selected via the user interface; a content of the reference device information; and a content of the device information, and further configured to receive a command for modifying the device information; and a control unit configured to modify the device information based on the command received from the manipulation & display unit and configured to obtain the device information from the substrate processing device based on the reference device information and transmit a modified device information to the substrate processing device.

<Supplementary Note 28>

According to still another aspect of the present invention, there is provided a management apparatus connected to a substrate processing device configured to store a device information for processing a substrate, the management apparatus including:

a manipulation & display unit including a user interface for selecting a reference device information, and configured to display: a difference between the device information obtained from the substrate processing device and the reference device information selected via the user interface; a content of the reference device information; and a content of the device information, and further configured to receive a command for modifying the device information; and a control unit configured to modify the device information based on the command received from the manipulation & display unit and configured to transmit a modified device information to the substrate processing device.

<Supplementary Note 29>

According to still another aspect of the present invention, there is provided a substrate processing system including:

a substrate processing device configured to store a device information for processing a substrate; and a management apparatus connected to the substrate processing device, the management apparatus including:

a manipulation & display unit including a user interface for selecting a reference device information, and configured to display: a difference between the device information obtained from the substrate processing device and the reference device information selected via the user interface; a content of the reference device information; and a content of the device information, and further configured to receive a command for modifying the device information; and a control unit configured to modify the device information based on the command received from the manipulation & display unit and configured to transmit a modified device information to the substrate processing device.

<Supplementary Note 30>

According to still another aspect of the present invention, there is provided a method of updating a device information, the method including:

(a) determining a difference between a device information for processing a substrate obtained from a substrate processing device and a reference device information;

(b) displaying the difference, a content of the reference device information and a content of the device information;

(c) receiving a command for modifying the device information; and (d) modifying the device information based on the command and transmitting a modified device information to the substrate processing device.

<Supplementary Note 31>

According to still another aspect of the present invention, there is provided a non-transitory computer-readable recording medium storing therein a device information update program causing a computer to perform:

(a) determining a difference between a device information for processing a substrate obtained from a substrate processing device and a reference device information;

(b) displaying the difference, a content of the reference device information and a content of the device information;

(c) receiving a command for modifying the device information; and (d) modifying the device information based on the command and transmitting a modified device information to the substrate processing device.

<Supplementary Note 32>

In the management apparatus of Supplementary note 28, preferably, the manipulation & display unit further includes a registration unit configured to register the substrate processing device based on the reference device information, and the registration unit is further configured to store a name of the substrate processing device, a selection information of a master file, a name of a comparison file and a edit flag which indicates whether the comparison file is edited.

<Supplementary Note 33>

In the management apparatus of Supplementary note 28, preferably, the manipulation & display unit is further configured to display a device information comparison screen showing the content of the reference device information and the content of the device information, and further display a button for displaying only the difference on the device information comparison screen.

<Supplementary Note 34>

In the management apparatus of Supplementary note 28, preferably, the management apparatus is further connected to a plurality of substrate processing devices, and the manipulation & display unit is further configured to display a device information comparison screen showing the content of the reference device information and the content of device information of the plurality of substrate processing devices and to further display: at least one of a first user interface for assigning a device information of one of the plurality of substrate processing devices as the reference device information; a second user interface for selecting at least one of the plurality of substrate processing devices to not display a device information of the at least one of the plurality of substrate processing devices; and a third user interface for sorting each device information of the plurality of substrate processing devices based on a predetermined parameter in the reference device information.

<Supplementary Note 35>

In the management apparatus of Supplementary note 34, preferably, the manipulation & display unit is further configured to compare each device information of the plurality of substrate processing devices to the reference device information when the device information of one of the plurality of substrate processing devices is assigned as the reference device information and display a content of each device information of the plurality of substrate processing devices and the reference device information.

<Supplementary Note 36>

In the management apparatus of Supplementary note 28, preferably, the device information includes a parameter for processing a substrate with the substrate processing device.

<Supplementary Note 37>

In the management apparatus of Supplementary note 28, preferably, the manipulation & display unit is further configured to display the difference in distinctive manner.

<Supplementary Note 38>

In the management apparatus of Supplementary note 28, preferably, the manipulation & display unit is further configured to display differences before modification and after modification in different colors.

The present invention is preferably used in a processing system in which a difference between pieces of device information of processing devices is determined and a process of updating the device information is performed.

What is claimed is:

1. A management apparatus for improving processing efficiency of a substrate, the apparatus connected to a plurality of substrate processing devices, each of the plurality of substrate processing devices stores device information for processing a substrate including at least a control parameter including a pressure parameter, a temperature parameter and a gas flow rate parameter used for a substrate processing recipe, the management apparatus comprising:

a memory that stores: device information stored in a file including a recipe file storing a substrate processing recipe and a parameter file selected from a group including the pressure parameter, the temperature parameter and the gas flow rate parameter; and a device information identifier (ID) for identifying the device information;

a manipulation & display that receives a command and display the device information;

a communication network that communicates with the plurality of substrate processing devices; and a controller that executes a device information update program for comparing the file and updating the device information stored as the file, wherein the controller: (a) sets a master file including the recipe file and the parameter file stored in a first one of the plurality of substrate processing devices; (b) obtains second device information including the control parameter stored as a second file having same name as the master file from a second one of the plurality of substrate processing devices other than the first one of the plurality of substrate processing devices based on a reference device information including the control parameter; (c) displays the reference device information and a difference between the second device information and the reference device information on the manipulation & display; (d) generates modified device information including the control parameter by modifying the second device information when a command for modifying the difference is received from the manipulation & display; and (e) transmits the modified device information including the control parameter to the second one of the plurality of substrate processing devices, wherein, in (c), the controller: compares the reference device information including the control parameter stored in the master file with the second device information including the control parameter stored in the second file with the same name as the master file; displays a matching portion between the reference device information and the second device information as a blank space on the manipulation & device; and displays a different portion between the reference device information and the second device information on the manipulation & device.

2. The management apparatus of claim 1, wherein the manipulation & display further includes a registration part registers the second one of the plurality of substrate processing devices based on the reference device information, and the registration part is further stores a name of the second one of the plurality of substrate processing devices, a selection information of the master file, a name of a comparison file and an edit flag indicative of whether the comparison file is edited.

3. The management apparatus of claim 1, wherein the manipulation & display displays a device information comparison screen showing a content of each of the reference device information and the second device information, and to further display a button for displaying only the difference on the device information comparison screen.

4. The management apparatus of claim 1, wherein the management apparatus is further connected to a plurality of substrate processing devices, and the manipulation & display displays a device information comparison screen showing a content of the reference device information and a content of each device information of the plurality of substrate processing devices and to further display: a first user interface for assigning the master file as the reference device information; a second user interface for selecting one of the plurality of substrate processing devices to not display device information thereof; and a third user interface for sorting the each device information of the plurality of substrate processing devices based on a predetermined parameter in the reference device information.

5. The management apparatus of claim 4, wherein the manipulation & display displays a content of the each device information of the plurality of substrate processing devices and the reference device information.

6. The management apparatus of claim 4, wherein the manipulation & display displays a menu in the device information comparison screen, wherein the menu comprises a changing part changes a substrate processing apparatus storing the reference device information; a hiding part hides a substrate processing apparatus whose device information need not be compared with the reference device information; and a sorting part performs sorting based on a predetermined parameter of the reference device information.

7. The management apparatus of claim 6, wherein the manipulation & display displays the difference between the reference device information and the device information for the difference to be edited by repeatedly selecting one among the changing part, the hiding part and the sorting part on the menu.

8. The management apparatus of claim 1, wherein the manipulation & display displays the difference such that the difference is distinguished from non-different parts of the second device information and the reference device information.

9. The management apparatus of claim 1, wherein the manipulation & display displays differences before modification and after modification in different colors.

10. The management apparatus of claim 1, wherein the file is selected from a group including a substrate processing recipe for performing the substrate processing and an alarm recipe and an abort recipe that are executed when an error occurs during performing the substrate processing recipe.

11. The management apparatus of claim 1, wherein a parameter file used for a pre-delivered substrate processing device is set as the master file.

12. A non-transitory computer-readable recording medium for improving processing efficiency of a substrate, th non-transitory computer readable medium storing therein a device information update program, executed in a management apparatus connected to a plurality of substrate processing devices, each of the plurality of substrate processing devices stores device information including at least a control parameter including a pressure parameter, a temperature parameter and a gas flow rate parameter used for a substrate processing recipe, the device information update program causing a controller to perform:
(a) setting a master file including a recipe file and a parameter file stored in a first one of the plurality of substrate processing devices;
(b) obtain second device information including the control parameter stored as a second file having same name as the master file from a second one of the plurality of substrate processing devices other than the first one of the plurality of substrate processing devices based on a reference device information including the control parameter;
(c) displaying the reference device information including the control parameter and a difference between the second device information and the reference device information;
(d) generating modified device information including the control parameter by modifying the second device information for modifying the difference; and
(e) transmitting the modified device information including the control parameter to the second one of the plurality of substrate processing devices,
wherein, (c) comprises: comparing the reference device information stored in the master file with the second device information stored in the second file with the same name as the master file; displaying a matching portion between the reference device information and the second device information as a blank space; and displaying a different portion between the reference device information and the second device information.

* * * * *